US012078665B2

(12) United States Patent
Haunberger et al.

(10) Patent No.: US 12,078,665 B2
(45) Date of Patent: Sep. 3, 2024

(54) MEASURING ASSEMBLY FOR DETECTING INTERMODULATIONS

(71) Applicant: Telefonaktiebolaget LM Ericsson (publ), Stockholm (SE)

(72) Inventors: Thomas Haunberger, Bad Reichenhall (DE); Christian Steininger, Tuntenhausen (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 458 days.

(21) Appl. No.: 17/432,471

(22) PCT Filed: Feb. 20, 2020

(86) PCT No.: PCT/EP2020/054453
§ 371 (c)(1),
(2) Date: Aug. 19, 2021

(87) PCT Pub. No.: WO2020/169718
PCT Pub. Date: Aug. 27, 2020

(65) Prior Publication Data
US 2022/0146559 A1    May 12, 2022

(30) Foreign Application Priority Data
Feb. 20, 2019    (DE) .......................... 102019104322.0

(51) Int. Cl.
*G01R 23/20*    (2006.01)
*H04B 1/40*     (2015.01)
*H04B 17/00*    (2015.01)

(52) U.S. Cl.
CPC ............... *G01R 23/20* (2013.01); *H04B 1/40* (2013.01); *H04B 17/00* (2013.01)

(58) Field of Classification Search
CPC .......... G01R 23/20; H04B 1/40; H04B 17/00
See application file for complete search history.

(56) References Cited

U.S. PATENT DOCUMENTS 7,265,557 B2    9/2007    Motta et al.
8,816,672 B1 *  8/2014    Bradley ............... H04B 17/309
                                                 324/624

(Continued)

FOREIGN PATENT DOCUMENTS

DE    10 2012 009317 A1    11/2013

OTHER PUBLICATIONS

Jim Norton, Application Note: Effects of Directivity on Power, VSWR and Return Loss Measurement Accuracy, available at https://web.archive.org/web/20160823082858/http://f1frv.free.fr/main5o_Bi-Directional_coupler_fichiers/Couplers_Directivity.pdf on Aug. 23, 2016 (Year: 2016).*

(Continued)

*Primary Examiner* — Daniel R Miller
(74) *Attorney, Agent, or Firm* — Sage Patent Group

(57) ABSTRACT

A measuring assembly for detecting intermodulations which limits the source of the intermodulations includes a first measuring device including a signal generation device and a signal measuring device. The signal generation device is designed to generate test signals and to output the test signals at an output connection, and the signal measuring device is designed to measure signals that are applied at the output connection. The assembly further includes a second measuring device with an input connection and a signal measuring device. The signal measuring device of the second measuring device is designed to measure signals that are applied at the input connection. The assembly further includes a directional coupler coupled to the first measuring device and the second measuring device.

20 Claims, 11 Drawing Sheets

(56) References Cited

U.S. PATENT DOCUMENTS

Figure 1:
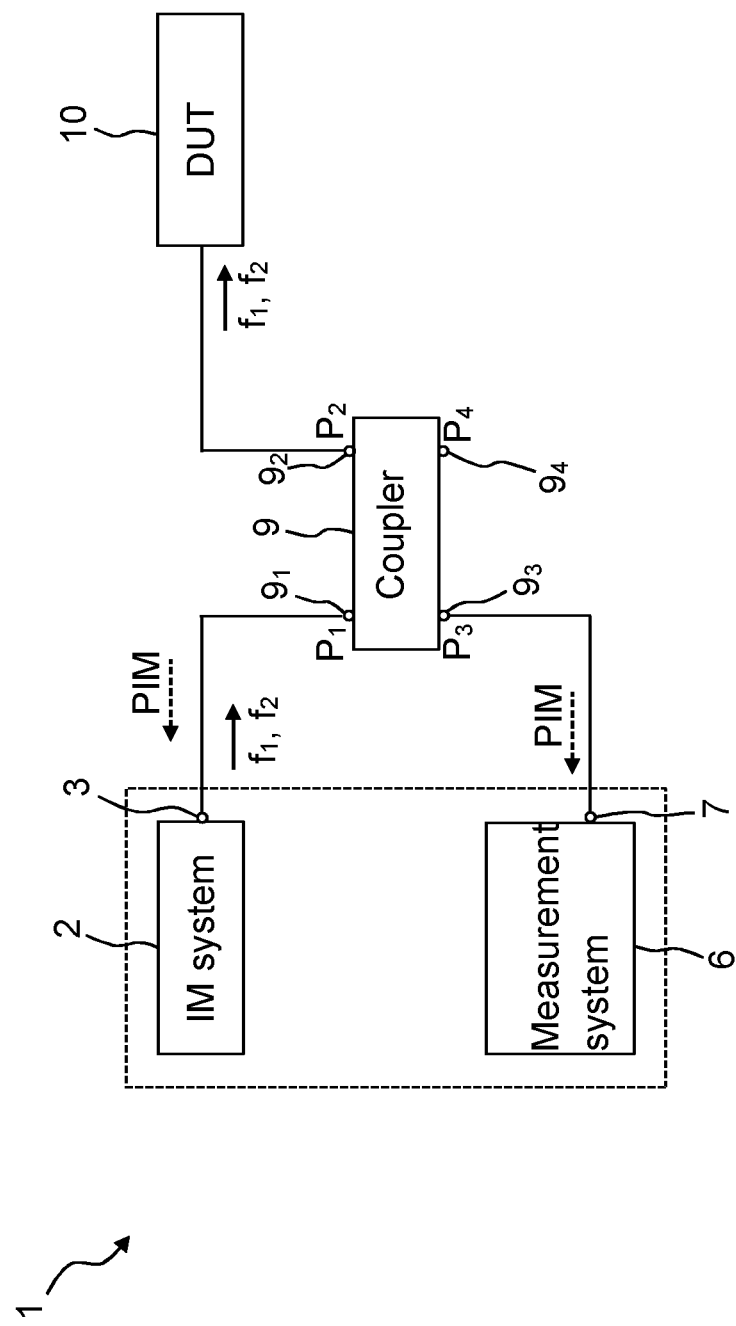

| | | | | |
|---|---|---|---|---|
| 2009/0096466 A1* | 4/2009 | Delforce | .............. | H04B 17/327 |
| | | | | 324/612 |
| 2014/0002097 A1* | 1/2014 | Yagi | ....................... | G01R 23/20 |
| | | | | 324/520 |
| 2017/0302390 A1 | 10/2017 | Entsfellner et al. | | |

OTHER PUBLICATIONS

International Search Report and Written Opinion of the International Searching Authority, PCT/EP2020/054453, mailed May 25, 2020, 11 pages.

German Office Action dated Jan. 30, 2020 for German Patent Application No. 10 2019 104 322.0, 12 pages (including English translation).

Wilkerson, Jonathan R., et al. "Passive Intermodulation Distortion in Antennas," IEEE Transactions on Antennas and Propagation, vol. 63, No. 2, Feb. 2015, pp. 474-482.

\* cited by examiner

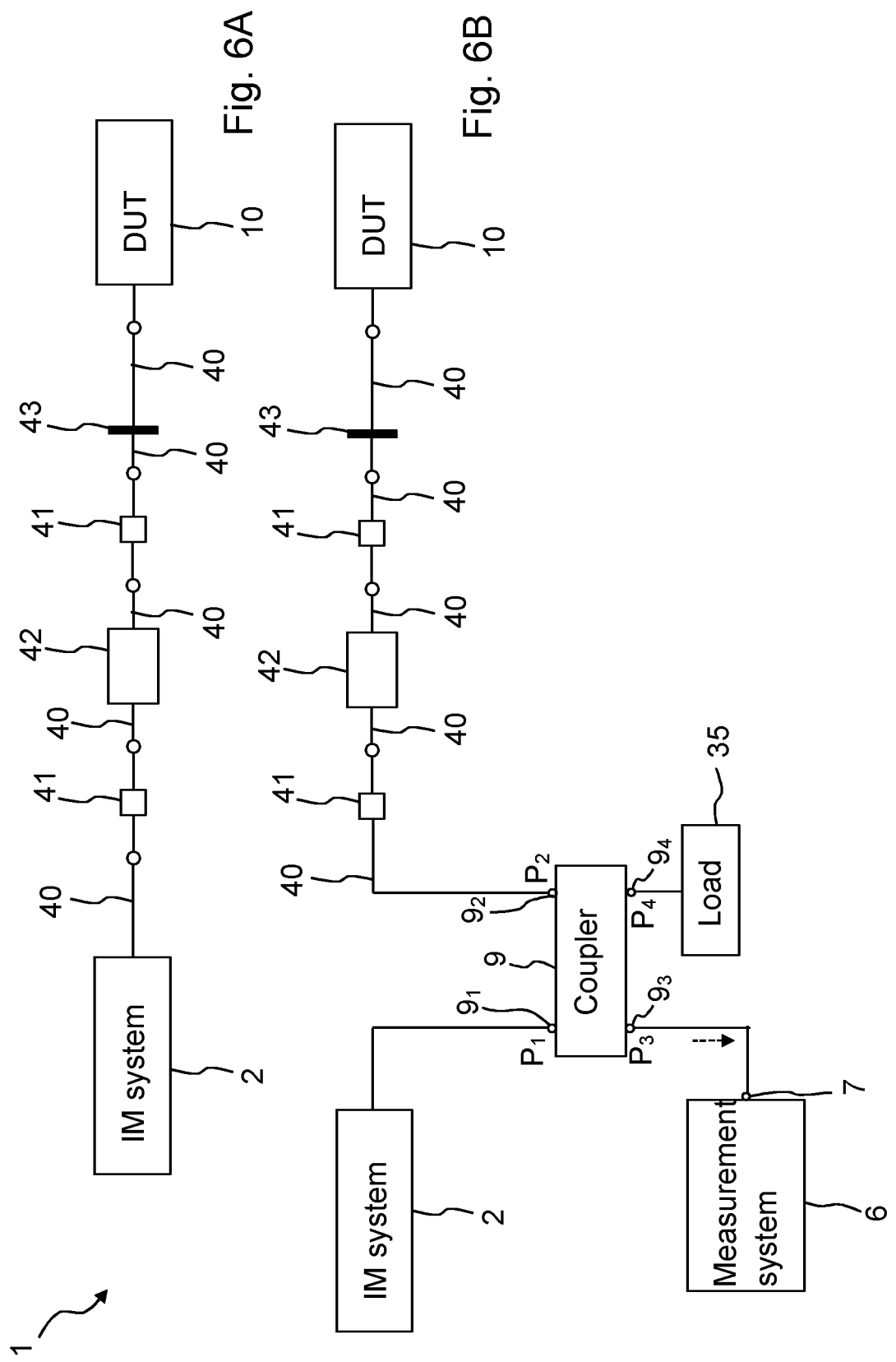

MEASURING ASSEMBLY FOR DETECTING INTERMODULATIONS

CROSS REFERENCE TO RELATED APPLICATIONS

This application is a 35 U.S.C. § 371 national stage application of PCT International Application No. PCT/EP2020/054453 filed on Feb. 20, 2020, which in turns claims foreign priority to German Patent Application No. 102019104322.0, filed on Feb. 20, 2019, the disclosures and content of which are incorporated by reference herein in their entirety.

The invention relates to a measuring assembly for detecting intermodulations.

Nowadays, electronic devices have to perform increasingly more functions or have to be used for higher frequencies. The effort required for the fault-free manufacture of these electronic devices is increasing. Any faults must therefore be detected and corrected directly during the manufacturing process because a replacement during later operation would not only be uneconomical, but it would also affect the availability of various services. Within the context of this invention, protection is provided for a measuring assembly for detecting intermodulations. This measuring assembly is used for testing such electronic devices (device under test (DUT)), which include, for example, antennas, filters, etc. Corresponding measuring devices, which can also be referred to as IM devices, are used to detect any intermodulations. Such a measuring device is connected to the device under test. Thereby, the measuring device generates different carrier frequencies, which are supplied to the device under test. These carrier frequencies are located, in particular, within a frequency range at which the device under test operates. Preferably, the carrier frequencies are frequencies that are used in a corresponding mobile communications band. Interference points within the measuring set-up can cause intermodulations to occur when two carrier frequencies are used. FIM=2 F1−F2 applies to the intermodulation frequency (of third order). Of course, the intermodulation frequency can also be of a higher order. The problem is when the intermodulation frequency falls in a frequency range in which received signals are transmitted. These received signals (in a reception signal band of a communications band such as a mobile communications band) usually only have low levels of power, which are amplified by a low-noise amplifier (LNA) at the receiver and are therefore very sensitive to corresponding intermodulations. In the event, for example, that the first carrier frequency is 935 MHz and the second carrier frequency is 960 MHz, intermodulations can occur at 910 MHz for example. These intermodulations then fall into the frequency range of the reception band.

As explained, these intermodulations can have different causes. A cause can naturally be seen in a defective device under test (DUT). This must then be repaired. However, another cause may also lie in the measuring set-up. Faulty connection contacts, ageing phenomena, cable breaks, faulty galvanizations, faulty soldering points, corrosion, transitions (plug, socket) can all trigger intermodulations. In the past, however, it has been very difficult to pin down the source of intermodulation.

It is therefore the object of the present invention to create a measuring assembly for the detection of intermodulations which limits the source of these intermodulations as precisely as possible in order to be able to make statements as to whether the device under test or the rest of the measuring system is defective.

The task is achieved by means of the measuring assembly according to the invention for detecting intermodulations according to Claim 1. Favourable further embodiments of the measuring assembly according to the invention are described in the dependent claims.

The measuring assembly according to the invention for detecting intermodulations comprises a first measuring device and a second measuring device. The first measuring device has an output connection (this can also be called a measuring gate). The first measuring device furthermore comprises a signal generation device and a signal measuring device. The signal generation device of the first measuring device is designed to generate test signals and to output these at the output connection. In particular, various signals having different frequencies are simultaneously generated. In particular, the frequencies have to do with those frequencies which are provided as carrier frequencies, for example, at a mobile communications standard and which the device under test is also confronted with during normal use. At least two different test signals with different frequencies are generated and output simultaneously. The signal measuring device of the first measuring device is then designed to measure signals (in particular, signal levels of signals) that are applied at the output connection; The second measuring device comprises an input connection, which can also be called a measuring gate, and a signal measuring device. The signal measuring device of the second measuring device is also designed to measure signals (in particular, signal levels of signals) that are applied at the input connection; The measuring assembly also comprises a directional coupler, which can also be called an IM director. This directional coupler comprises a first, a second, and a third connection. These connections can also be called gates or connection gates. Thereby, the output connection of the first measuring device is connected to the first connection of the directional coupler, whereas the second connection of the directional coupler can be connected to a device under test (DUT). The input connection of the second measuring device is connected to the third connection of the directional coupler. The directional coupler is designed to transmit signals from the first connection to the second connection and to output them at the third connection, thereby being attenuated with a first attenuation factor. In this case, these signals are, for example, the test signals. If intermodulations occur between the directional coupler and the first measuring device, then these intermodulations are also transmitted from the first connection to the second connection and output at the third connection, thereby being attenuated using the first attenuation factor. The directional coupler is furthermore designed to transmit signals from the second connection to the first connection and to output them at the third connection, thereby being attenuated with a second attenuation factor. Thereby, the first and the second attenuation factor are different. For example, the first attenuation factor could be greater than 2 dB, 3 dB, 4 dB but preferably less than 6 dB, whereas the second attenuation factor is greater than 25 dB, 30 dB, 40 dB, 50 dB or greater than 60 dB. A signal transmitted from the first connection to the second connection of the directional coupler would therefore be output at the third connection of the directional coupler, thereby being less strongly attenuated than a signal transmitted from the second connection to the first connection of the directional coupler. However, in principle, the second attenuation factor could also be smaller than the first attenuation factor. Thus, the second attenuation factor could be greater than 2 dB, 3 dB, 4 dB but less than 6 dB, whereas the first attenuation factor is greater than 25 dB, 30 dB, 40 dB, 50 dB, or greater than 60 dB. In this case, signals transmitted from the first connection to the second connection of the directional coupler would be output at the third connection, thereby being more strongly attenuated than signals transmitted from the second connection to the first connection of the directional coupler.

If the second attenuation factor is greater than the first attenuation factor and an intermodulation between the first measuring device and the directional coupler occurs, then both the first measuring device and the second measuring device clearly indicate this intermodulation. A user therefore knows that intermodulation occurs in the area between the directional coupler and the first measuring device. If, in contrast, the interference point is located between the directional coupler and the device under test, the first measuring device indicates a significantly higher signal level than the second measuring device (provided that the second attenuation factor is greater than the first attenuation factor). A user can therefore locate the interference point.

Preferably, the directional coupler is connected as close as possible to the device under test. There are therefore preferably less than four or less than three connection points between the directional coupler and the device under test. These connection points can be screw connections for example. Furthermore, the cable length for the connection between the directional coupler and the device under test is preferably less than 5 m, 4 m, 3 m, 2 m or less than 1 m. The connections between the second measuring device and the directional coupler are tested several times so that it is ruled out that these contain an interference point for an intermodulation. In particular, the entire measuring assembly (except the DUT) is finalized and tested with a low-intermodulation load, thereby ensuring that the measuring assembly is operating in a fault-free manner A low-intermodulation load is understood to mean that no intermodulations occur or that the intermodulations are insignificant, i.e. their level is below a threshold value. If a fault is detected during the actual measurement that is not due to the device under test (DUT) but is in the rest of the measuring assembly, then this fault can be clearly associated with the measuring assembly. An elaborate troubleshooting and alleged repair of the device under test (DUT) can thus be avoided.

For the first time, due to the invention, a clear association of an IM problem is possible. Thus, it can be clearly stated whether the IM problem occurs on the device under test (DUT, e.g. antenna) or on the measuring assembly. Because it has not been possible up until this point to rule out the possibility that the IM problem also originates from the device under test up, this has been opened and repaired. However, an error is usually not clearly visible and so prophylactic measures (re-soldering, tightening screws, etc.) are carried out. These processes take time and therefore also cost money. Thereby, under certain circumstances, other parts of the device under test can also be damaged, which are only detected at the next measurement. Due to the present invention, unnecessary repairs on the device under test can be avoided. Because in a series production, several hundreds of devices under test/day are sometimes tested using one measuring assembly in particular, it is very important to know whether the device under test needs to be repaired or whether the measuring assembly or measuring equipment (measuring devices) of the measuring assembly is defective.

Furthermore, previously existing measurement systems can be easily retrofitted/complemented by means of the invention.

In a further embodiment of the measuring assembly according to the invention, both the signal measuring device of the first measuring device as well as the signal measuring device of the second measuring device are designed to measure a spectrum of signals. The signal measuring devices of both measuring devices are preferably (only) designed to measure a spectrum of signals in a reception frequency range of a mobile communications band, wherein the test signals lie outside the reception frequency range, in particular, in a transmitting frequency range of the mobile communications band.

In a further embodiment according to the invention, the first measuring device and the second measuring device comprise a display and/or output device. The measuring assembly may comprise a common display and/or output device or various display and/or output devices, wherein, in this case, one display and/or output device is respectively assigned to the first and the second measuring device. The signal measuring device of the first measuring device is designed to display the spectrum of the measured signal on the display and/or output device. The same applies to the signal measuring device of the second measuring device, which is also designed to display the spectrum of the measured signal on the display and/or output device. A user can then easily determine, when looking at the two spectra calculated by the first and the second measuring device, in which area of the measuring assembly the intermodulation occurred, i.e. in which area of the measuring assembly the interference point is located.

In principle, this evaluation can also be carried out automatically. A control device is provided in a further embodiment of the measuring assembly for this purpose. The control device is then designed to determine, depending on the measurement values of the signal measuring device of the first measuring device and the measurement values of the signal measuring device of the second measuring device, if the interference point that causes intermodulation is located between the directional coupler and the first measuring device or between the directional coupler and the device under test (DUT).

This is achieved by comparing the signal levels (spectra) of the measured signals with one another. However, it must be taken into account whether, at the third connection of the directional coupler, to which the second measuring device is connected, a signal, which is transmitted from the first to the second connection of the directional coupler, is output, thereby being more strongly attenuated than a signal transmitted from the second connection in the direction of the first connection of the directional coupler or vice versa. In the event that the second attenuation factor of the directional coupler is greater than the first attenuation factor and thus, signals transmitted from the first connection to the second connection of the directional coupler are output at the third connection, thereby being attenuated less strongly than signals transmitted from the second connection to the first connection of the directional coupler, the control device operates as follows. If the interference point is located in an area between the directional coupler and the first measuring device, the control device then detects that a signal level of a signal measured by the signal measuring device of the first measuring device is above a first threshold value and that a signal level of a signal measured by the signal measuring device of the second measuring device reaches at least 20% of the level of the signal level of the signal measured by the signal measuring device of the first measuring device. In this case, the first measuring device would detect 100% of the signal level. This signal level is preferably output at the third connection of the directional coupler, thereby being attenuated by 3 dB (50%), whereby the second measuring device measures at least 50% of the signal level measured by the first measuring device. This is more than 20% so that the control device can reliably detect that the interference point is located between the directional coupler and the first measuring device.

The situation is different if the interference point is located between the directional coupler and the device under test (DUT). In this case, the signal (intermodulation signal) would be transmitted from the second connection in the direction of the first connection of the directional coupler. A signal level of the signal measured by the signal measuring device of the first measuring device would again be above a first threshold value, wherein a signal level of a signal measured by the signal measuring device of the second measuring device is smaller than 20% of the level of the signal level of the signal measured by the signal measuring device of the first measuring device. In this case, the first measuring device would still measure almost 100% of the signal level, whereas the second measuring device would measure a strongly attenuated signal (the attenuation is greater than 25 dB, 30 dB, 40 dB, 50 dB or greater than 60 dB). For this reason, the control device can reliably indicate that the interference point is located between the directional coupler and the device under test (DUT).

The situation is different if first attenuation factor is greater than the second attenuation factor. In this case, a signal transmitted from the second connection in the direction of the first connection of the directional coupler is output at the third connection of the directional coupler, thereby being less strongly attenuated than a signal transmitted from the first connection in the direction of the second connection of the directional coupler. If the interference point is again located in an area between the directional coupler and the device under test (DUT), the signal measuring device of the first measuring device measures a signal level that is above a first threshold value, and the signal measuring device of the second measuring device, in turn, measures a signal level that corresponds to at least 20% of the level of the signal level measured by the signal measuring device of the first measuring device. Conversely, if the interference point is located in an area between the directional coupler of the first measuring device, the signal measuring device of the first measuring device will continue to measure a signal level that is above a threshold value, however, in this case, the signal measuring device of the second measuring device measures a signal level that is smaller than 20% of the signal level measured by the signal measuring device of the first measuring device.

In a further embodiment according to the invention, the directional coupler comprises another fourth connection. The directional coupler is designed to transmit signals from the third connection to the fourth connection and to output them at the first connection, thereby being attenuated with a third attenuation factor. The directional coupler is furthermore designed to transmit signals from the fourth connection to the third connection and to output them at the first connection, thereby being attenuated with a fourth attenuation factor, wherein the third and the fourth attenuation factors are different. Preferably, the third attenuation factor is greater than 2 dB, 3 dB, 4 dB, 5 dB but, being furthermore preferred, less than 6 dB, whereas the fourth attenuation factor is preferably greater than 25 dB, 30 dB, 40 dB, 50 dB, or greater than 60 dB. It could also be in reverse (third attenuation factor greater than the fourth attenuation factor).

Generally, it preferably applies to the directional coupler that signals are transmitted from the first connection to the second connection in unattenuated form (the attenuation is less than 2 dB, 1 dB, 0.5 dB). The same also applies from the second connection in the direction of the first connection or from the third connection in the direction of the fourth connection or from the fourth connection in the direction of the third connection.

In a preferred embodiment of the measuring assembly, the fourth connection of the directional coupler is finalized with a load. Thereby, this can preferably be an ohmic load. Preferably, thereby, it has to do with 50 ohms or 75 ohms. The load has the task of (fully) absorbing the energy from signals that are output at the fourth connection so that these signals are not reflected back into the fourth connection.

In a preferred embodiment, however, an antenna is connected to the fourth connection. This antenna is, for example, a dipole antenna or a logarithmic-periodic antenna. Such an antenna can also be called a sniffer antenna.

Such an antenna additionally offers the advantage that interference sources outside the measuring assembly, which, in particular, couple into the measuring assembly in a wireless manner, in particular into the device under test, can also be reliably identified as such.

In a preferred further embodiment, a measuring chamber is provided, in which the device under test (DUT) can be arranged. The antenna is arranged outside the measuring chamber. The measuring chamber shields the device under test from the environment (attenuation is greater than 30 dB in particular), whereby the device under test (DUT) is not influenced or only slightly influenced by (mobile communications or interference) signals outside the measuring chamber. These (mobile communications or interference) signals can be DECT signals (digitally enhanced cordless communications) or WLAN signals or repeater signals for example.

Even using an antenna, which is connected to a fourth connection of the directional coupler, it is automatically possible to determine whether an additional interference source is located inside or outside the measuring chamber. For this purpose, the or a further control device can be provided. The control device is designed to determine, depending on the measurement values of the signal measuring device of the first measuring device and the measurement values of the signal measuring device of the second measuring device, if the interference source is located inside or outside the measuring chamber and couples into the measuring assembly in a wireless manner.

In this case that the second attenuation factor is greater than the first attenuation factor and that the fourth attenuation factor is greater than the third attenuation factor, the control device is designed to assign the interference source to an area outside the measuring chamber if a signal level of a signal measured by the signal measuring device of the first measuring device is smaller than a signal level of a signal measured by the signal measuring device of the second measuring device. In this case (interference source outside the measuring chamber), the interference source would couple more strongly into the antenna than into the device under test within the measuring chamber, because the measuring chamber has attenuating or shielding characteristics. The signal of the interference source would therefore be transmitted from the fourth connection to the third connection. In contrast, this signal would be output at the first connection, thereby being very strongly attenuated by the antenna (fourth attenuation factor is greater than the third attenuation factor). The signal of the interference source, which is also strongly attenuated by the measuring chamber and couples into the device under test, would then, in turn, only be transmitted from the fourth connection in the direction of the first connection, thereby being very strongly attenuated (by means of the measuring chamber). Therefore, the first measuring device measures a lower signal level than the second measuring device, whereas, in this case (attenuation factors), the interference source is outside the measuring chamber. Due to the different levels, it is also possible to reliably detect whether there is an interference point (both measuring devices measure a similarly high level or only one measuring device measures a level) or whether there is an interference source (both measuring devices measure a level, wherein the level difference does not exceed a predetermined threshold value).

If the interference source is inside the measuring chamber, a signal level measured by the signal measuring device of the first measuring device is greater than a signal level measured by the signal measuring device of the second measuring device. This is because the interference source can now more easily couple into the device under test and the resulting signal is transmitted from the second connection in the direction of the first connection (unattenuated), whereas this signal is output at the third connection (second measuring device), thereby being strongly attenuated. Due to the fact that the measuring chamber also strongly attenuates the signal, the antenna can only receive this in attenuated form and pass it on to the third connection via the fourth connection. The second measuring device therefore receives a lower signal level than the first measuring device and the control device can reliably state that the interference source is located inside the measuring chamber. However, this signal level received by the second measuring device is greater than a signal level that the second measuring device would receive if the device under test had an interference point (in this case, the antenna would not receive a signal).

The situation is different if first attenuation factor is greater than the second attenuation factor and the third attenuation factor is greater than the fourth attenuation factor. In this case, the control device is designed to assign the interference source to an area outside the measuring chamber if a signal level of a signal measured by the signal measuring device of the first measuring device is smaller than a signal level of a signal measured by the signal measuring device of the second measuring device. Conversely, the control device is designed to assign the interference source to an area within the measuring chamber if a signal level of a signal measured by the signal measuring device of the first measuring device is greater than a signal level of a signal measured by the signal measuring device of the second measuring device.

In a preferred embodiment, the second measuring device comprises an amplifier device that is designed to amplify the signal at the input connection. This amplifier device includes one or a plurality of amplifiers. The amplifier device preferably comprises at least one LNA (low-noise amplifier).

A calibration device could also be provided. The calibration device serves to ensure that the first and second measuring devices display comparably high signal levels. The calibration device is designed to generate and to output an intermodulation signal. In particular, this signal is generated in the reception frequency range of a mobile communications band. The calibration device can be arranged, for example, between the directional coupler and the first measuring device. The second attenuation factor in this case would be greater than the first attenuation factor, wherein a gain factor of the amplifier device of the second measuring device is adjustable in such a way that a measured signal level of the second measuring device approximately corresponds to the measured signal level of the first measuring device. The first measuring device could also be calibrated by adjusting the gain factor or by means of attenuators accordingly. In this case, the gain factor of the second measuring device should be 3 dB, for example, in order to compensate for the attenuation via the directional coupler. The calibration device could also be arranged between the directional coupler and the device under test (DUT). In this case, the first attenuation factor is greater than the second attenuation factor. A gain factor of the amplifier device of the second measuring device should then be adjustable in such a way that a measured signal level of the second measuring device approximately corresponds to the measured signal level of the first measuring device. Here too, the gain factor should be approximately 3 dB to compensate for the attenuation by the directional coupler.

In a preferred embodiment, the second measuring device comprises another RX/TX filter assembly. This RX/TX filter assembly includes a common connection, which is connected to the third connection of the directional coupler. Furthermore, the RX/TX filter assembly comprises an RX connection and a TX connection. The RX/TX filter assembly has a attenuation/transmission gate function in such a way that signals in a transmission frequency band are allowed to pass from the TX connection to the common connection and signals in a reception frequency band are allowed to pass from the common connection to the RX connection, whereas a trap attenuation is applied to signals from the TX connection to the RX connection and to signals in a reception frequency band from the common connection to the TX connection. The RX/TX filter assembly is therefore particularly designed to apply a high trap attenuation to the test signals that are also applied at the common connection so that these are not applied at the RX connection or only applied in a very strongly attenuated form The trap attenuation shall comprise at least 25 dB, 30 dB, 34 dB or more than 35 dB. The wording "allowed to pass" means that the signals with less than 2 dB, 1 dB or with less than 0.5 dB are attenuated.

In a preferred embodiment, the RX connection of the RX/TX filter assembly is directly connected to the amplifier device. Preferably, however, a bandpass assembly is provided, wherein a first connection of this bandpass assembly is connected to the RX connection and wherein a second connection of this bandpass assembly is connected to the amplifier device. The bandpass assembly is designed to only allow signals through (i.e. attenuated with less than 2 dB, 1 dB or less than 0.5 dB) that fall into a reception band of a certain mobile communications band. Signals that do not fall into the reception band should preferably be attenuated by more than 25 dB, 30 dB, 34 dB or more than 35 dB. The test signals of the first measuring device are among the signals that are to be strongly attenuated.

Preferably, the signal measuring device of the second measuring device comprises a spectrum analyser, which, in turn, is connected to the amplifier device. Such a spectrum analyser can also comprise the first measuring device. In principle, a network analyser could also be used.

In a preferred further embodiment of the measuring assembly, the signal generation device of the first measuring device comprises a first and a second signal generator. The first signal generator is designed to generate a test signal at a first frequency. The second signal generator is designed to generate a test signal at a second frequency, wherein both frequencies are different. The signal generation device of the first measuring device furthermore comprises a first amplifier device and a second amplifier device. The first amplifier device is designed to amplify the test signal of the first signal generator, whereas the second amplifier device is designed to amplify the test signal of the second signal generator. The outputs of the first and second amplifier device of the first measuring device combined at the output connection of the first measuring device (at the latest). Such a combining can be performed, for example, via a combiner.

Preferably, the signal generation device of the first measuring device comprises another first and a second attenuation device. The first attenuation device is arranged between the second signal generator and the first amplifier device, and the second attenuation device is arranged between the second signal generator and the second amplifier device. Preferably, the respective amplifiers of the first and second amplifier device work in the linear range and entail a constant amplification. The levels of the test signals are then determined by the respective first or second attenuation device.

In another embodiment, the first measuring device also comprises another RX/TX filter assembly. This RX/TX filter assembly comprises a common connection, which is connected to the output connection of the first measuring device. The RX/TX filter assembly also comprise an RX connection and a TX connection. The RX/TX filter assembly also has a attenuation/transmission gate function in such a way that test signals in a transmission frequency band are allowed to pass from a TX connection to the common connection and signals (e.g. intermodulation signals) in a reception frequency band are allowed to pass from the common connection to the RX connection (the attenuation is less than 2 dB, 1 dB, 0.5 dB) and that a trap attenuation (more than 25 dB, 30 dB, 34 dB or more than 35 dB) is applied to test signals from the TX connection to the RX connection and to signals (for example intermodulation signals) in a reception frequency band from the common connection to the TX connection. The outputs of the first and second amplifier device are combined at the TX connection of the RX/TX filter assembly of the first measuring device (at the latest). This can be done in advance, for example, by means of a combiner.

Thereby, the RX connection of the RX/TX filter assembly of the first measuring device can be directly connected to the signal measuring device of the first measuring device. Preferably however, a bandpass assembly is also provided. A first connection of this bandpass assembly is then connected to the RX connection of the RX/TX filter assembly. A second connection of this bandpass assembly is connected to the signal measuring device of the first measuring device. The bandpass assembly is preferably designed to allow only signals from the first connection to the second connection that fall into the reception band of a certain mobile communications band. The wording "allowed to pass" means that signals (e.g. intermodulation signals) are attenuated with less than 2 dB, 1.5 dB or less than 0.5 dB. Other signals, particularly test signals, are very strongly attenuated (more than 25 dB, 30 dB, 34 dB or more than 35 dB).

Figure 2A:
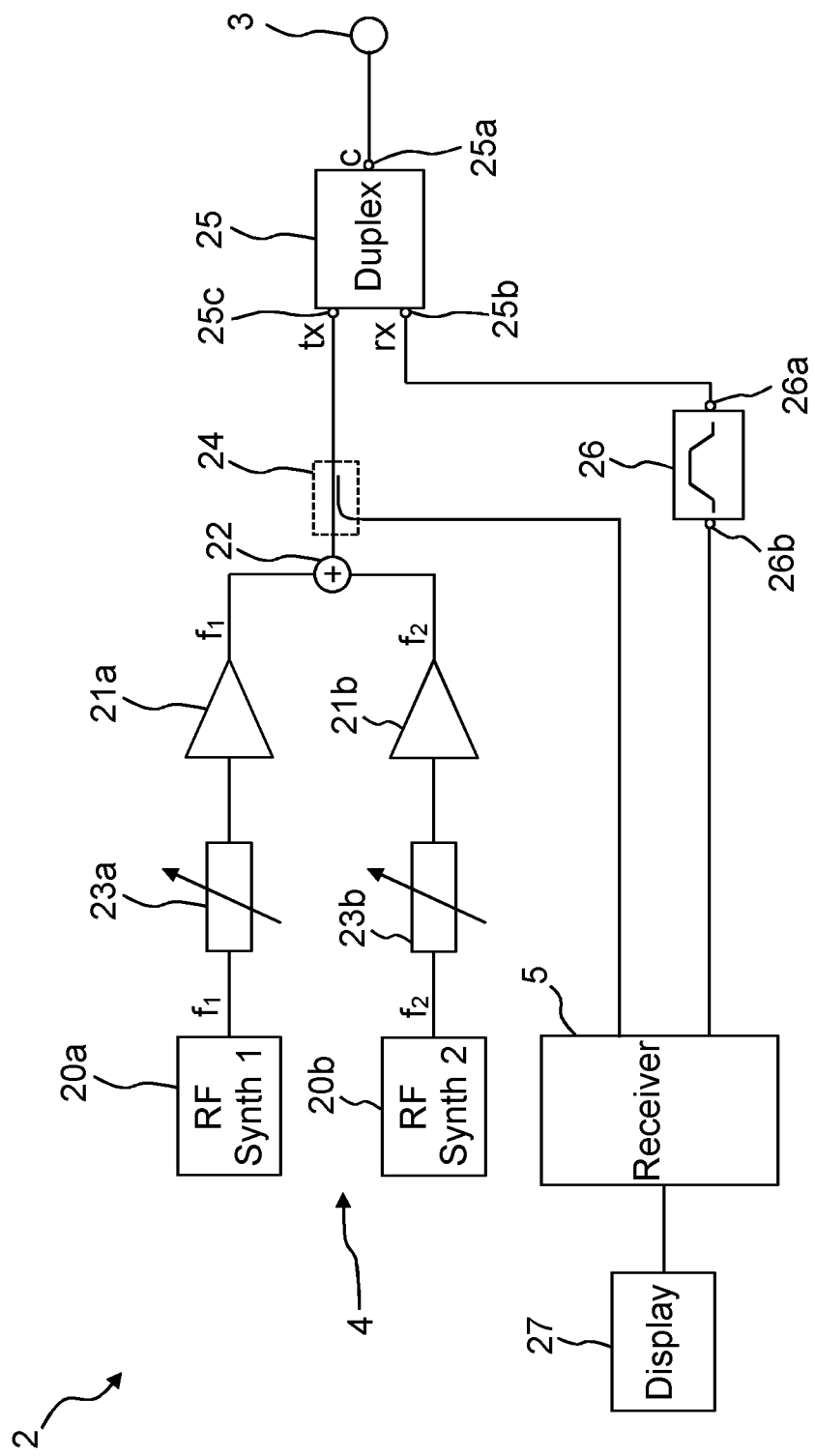
Figure 2B:
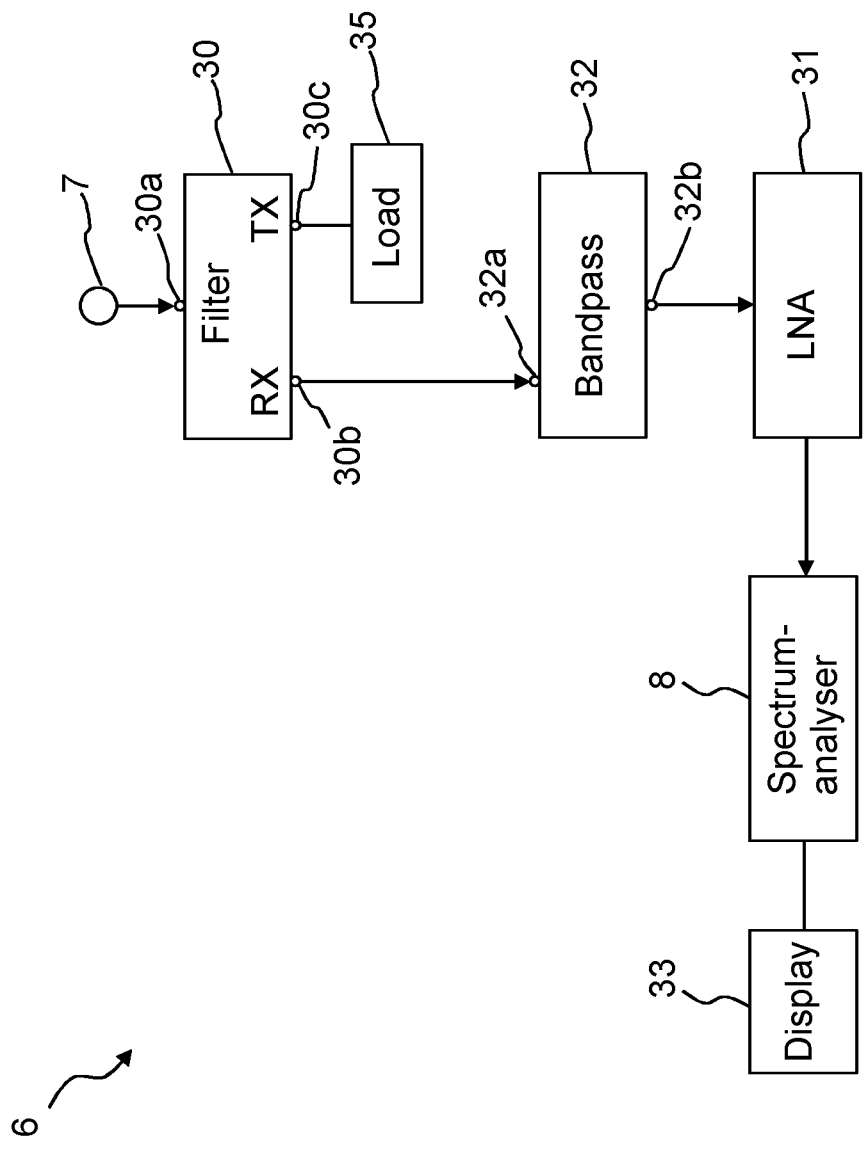

Various exemplary embodiments of the invention are described as examples in the following taking the drawings into account. The same objects have the same reference numbers. The corresponding figures of the drawings individually show:

FIG. 1: an overview circuit diagram of the measuring assembly for detecting intermodulations according to the invention;

FIG. 2A: an overview circuit diagram of an exemplary embodiment of the first measuring device;

FIG. 2B: an overview circuit diagram of an exemplary embodiment of the second measuring device;

FIGS. 3A, 3B, 4A, 4B, 4C, 4D and 5: various exemplary embodiments of the measuring assembly for measuring intermodulations according to the invention; and FIGS. 6A, 6B: various exemplary embodiments of the measuring assembly that can be indicate where the second measuring assembly can be connected.

FIG. 1 shows an overview static image of the measuring assembly 1 according to the invention for detecting intermodulations. The measuring assembly 1 comprises a first measuring device 2, which has an output connection 3. The first measuring device 2 comprises a signal generation device 4 (see FIG. 2A) and a signal measuring device 5. The signal generation device 4 of the first measuring device 2 is designed to generate signals $f_1$, $f_2$ and to output them at the output connection 3. These test signals $f_1$, $f_2$ are, in particular, signals that fall into a transmission frequency band of a mobile communications band. Interference points within the measuring assembly 1 can then cause intermodulation products or intermodulation frequencies to arise that fall into a reception band of the mobile communications band. These intermodulations or intermodulation frequencies are marked in FIG. 1 with the dashed arrow and the designation PIM.

The signal measuring device 5 of the first measuring device 2 is designed to measure signals that are applied to the output connection 3. Thereby in particular, only those signals are measured that lie in a reception band of the corresponding mobile communications band.

In FIG. 1, a second measuring device 6 is furthermore shown, which comprises an input connection 7 and a signal measuring device 8 (see FIG. 2B). The signal measuring device 8 of the second measuring device 6 is designed to measure signals that are applied on the input connection 7. These signals are also those that are in a reception band of the mobile communications band.

The wording "measure" is understood, in particular, to mean that the signal level, i.e. the spectrum of the signal, is measured. This can be done via a spectrum analyser or a network analyser.

In FIG. 1, the first measuring device 2 and the second measuring device 6 are formed within a dotted border. This should symbolize that the first measuring device 2 and the second measuring device 6 can be integrated in a common measurement system. For example, the first measuring device 2 and the second measuring device 6 can be formed on a common circuit board.

A directional coupler 9 is furthermore provided, which can be generally also be referred to as a director. This directional coupler 9 comprises at least a first, a second, and a third connection $9_1$, $9_2$ and $9_3$. In FIG. 1, the directional coupler 9 comprises another fourth connection $9_4$.

Thereby, the output connection 3 of the first measuring device 2 is connected to the first connection $9_1$ of the directional coupler 9. In contrast, the input connection 7 of the second measuring device 6 is connected to the third connection $9_3$ of the directional coupler 9. A device under test (DUT) 10 is or can be connected to the second connection $9_2$ of the directional coupler 9 or can be connected.

By a connection, in the context of this invention, an electrically conductive connection is understood, for example, by using a coaxial cable.

The directional coupler 9 is designed to transmit signals from the first connection $9_1$ to the second connection $9_2$. Thus, the test signals $f_1$, $f_2$, that the first measuring system 2 generates and outputs at the output connection 3 are also applied to the to the device under test 10. The directional coupler 9 is furthermore designed to output signals that are transmitted from the first connection $9_1$ to the second connection $9_2$ at the third connection $(9_3)$, thereby being attenuated with a first attenuation factor. The directional coupler 9 is furthermore designed to transmit signals from the second connection $9_2$ to the first connection 91 and to output them at the third connection $9_3$, thereby being attenuated with a second attenuation factor. The first and the second attenuation factor are different.

In this preferred installation, the second attenuation factor is greater than the first attenuation factor. That means that the signals, which are transmitted from the first connection $9_1$ to the second connection $9_2$ of the directional coupler 9, are output at the third connection $9_3$ of the directional coupler 9, thereby being less strongly attenuated than signals transmitted from the second connection $9_2$ to the first connection $9_1$ and output at the third connection $9_3$, thereby also being attenuated. The first attenuation factor is preferably greater than 1 dB, 2 dB, 3 dB, 4 dB, 5 dB but preferably less than 6 dB (in particular it is 3 dB), whereas the second attenuation factor is preferably greater than 25 dB, 30 dB, 40 dB, 50 dB or greater than 60 dB.

However, as mentioned above, the first attenuation factor could also be greater than the second attenuation factor. In this case, signals, which are transmitted from the second connection $9_2$ to the first connection $9_1$ of the directional coupler 9 are output at the third connection $9_3$ of the directional coupler 9, thereby being less strongly attenuated than signals that are transmitted from the first connection $9_1$ to the second connection $9_2$.

In the exemplary embodiment from FIG. 1, the directional coupler 9 is furthermore designed to transmit signals from the third connection $9_3$ to the fourth connection $9_4$ and to output them at the first connection $9_1$, thereby being attenuated with a third attenuation factor. Simultaneously, the directional coupler 9 is designed to transmit signals from the fourth connection $9_4$ to the third connection $(9_3)$ and to output them at the first connection $9_1$, thereby being attenuated with a fourth attenuation factor. The third and the fourth attenuation factor are different. Preferably, the fourth attenuation factor is greater than the third attenuation factor, which means that signals transmitted from the third connection $9_3$ to the fourth connection $9_4$ are output at the first connection $9_1$, thereby being less strongly attenuated than signals transmitted from the fourth connection $9_4$ to the third connection $9_3$. However, this could also be the other way around, according to which the third attenuation factor would be greater than the fourth attenuation factor. In this case, signals transmitted from the fourth connection $9_4$ in the direction of the third connection $9_3$ are output at the first connection $9_1$ thereby being less strongly attenuated than signals transmitted from the third connection $9_3$ in the direction of the fourth connection $9_4$.

The signal measuring device 5 of the first measuring device 2 and the signal measuring device 8 of the second measuring device 6 are particularly designed to measure a signal spectrum. In particular, the spectrum of a signal in the reception band of a mobile communications band is measured.

For better understanding, the structure of the first measuring device 2 will be described in more detail using FIG. 2A and the structure of the second measuring device 6 will be described in more detail using FIG. 2B. These explanations for the first measuring device 2 and the second measuring device 6 reflect only one exemplary embodiment. Another implementation would also be conceivable.

The signal generation device 4 of the first measuring device 2 comprises a first signal generator 20a and a second signal generator 20b. The first signal generator 20a is designed to generate a test signal at a first frequency $f_1$. The second signal generator 20b is designed to generate a test signal at a second frequency $f_2$. The first and second frequencies $f_1$, $f_2$ are different. Both frequencies lie in the transmission frequency band of the corresponding mobile communications band.

The signal generation device 4 of the first measuring device 2 furthermore comprises a first amplifier device 21a and a second amplifier device 21b. The first amplifier device 21a is designed to amplify the test signal $f_1$ of the first signal generator 20a. The second amplifier device 21b is designed to amplify the test signal $f_2$ of the second signal generator 20b.

The outputs of the first and second amplifier device 21a, 21b are combined at the output connection 3 of the first measuring device 2 (at the latest). In FIG. 2A, an adding unit 22 is shown, which combines the outputs of the first and the second amplifier device 21, 21b. This adding unit 22 is preferably a combiner.

The signal generation device 4 of the first measuring device 2 preferably comprises another first and another second attenuation device 23a, 23b. The first attenuation device 23a is arranged between the first signal generator 20a and the first amplifier device 21a; The second attenuation device 23b is arranged between the second signal generator 20b and the second amplifier device 21b. The level of the test signals $f_1$, $f_2$ is preferably set in such a way that the test signals $f_1$, $f_2$ have the same output level. The respective amplifier device 21a, 21b preferably operates with a constant amplification and, being furthermore preferred, in the linear range, so that the level of the test signals $f_1$, $f_2$ is changed only by controlling the respective attenuation device 23a, 23b.

The respective amplifier devices 21a, 21b preferably comprise one or a plurality of (transistor) power amplifiers.

A decoupling unit 24 can be arranged at the output of the adding unit 22. The decoupling unit 24 can decouple a part of the test signals $f_1$, $f_2$ and supply them to the signal measuring device 5 of the first measuring device 2. This allows statements to be made, for example, about the levels of the test signals $f_1$ and $f_2$.

The first measuring device 1 also preferably comprises another RX/TX filter assembly 25. This RX/TX filter assembly 25 comprises a common connection 25a, which is connected to the output connection 3 of the first measuring device 2. The RX/TX filter assembly 25 also comprises an RX connection 25b and a TX connection 25c. The TX connection 25c is connected to an output of the adding unit 22. The test signals $f_1$, $f_2$ of both signal generators 20a, 20b are supplied to the TX connection. The decoupling unit 24 is arranged between the adding unit 22 and the RX/TX filter assembly 25.

The RX/TX filter assembly 25 comprise an attenuation/transmission gate function in such a way that test signals $f_1$, $f_2$ in a transmission frequency band of the mobile communications band are allowed to pass from the TX connection 25c to the common connection 25a and signals in a reception frequency band of the mobile communications band are allowed to pass from the common connection 25a to the RX connection 25b. Simultaneously, a trap attenuation (more than 25 dB, 30 dB, 33 dB, 34 dB, or more than 35 dB) is applied to test signals $f_1$, $f_2$ from the TX connection 25c to the RX connection 25b and to signals in a reception frequency band of the mobile communications band from the common connection 25a to the TX connection 25c. The wording "allowed to pass" means that signals with less than 2 dB, 1 dB or less than 0.5 dB are attenuated.

The RX connection 25b of the RX/TX filter assembly 25 can be directly connected to the signal measuring device 5 for example. Preferably, however, a bandpass assembly 26 is provided. A first connection 26a of this bandpass assembly 26 is connected to the RX connection 25b of the RX/TX filter assembly 25. A second connection 26b of the bandpass assembly 26 is connected to the signal measuring device 5. The bandpass assembly 26 is designed to allow only signals from the first connection 26a to the second connection 26b that fall into the reception band of a certain mobile communications band. Thereby, the test signals $f_1$, $f_2$ should be applied with a high trap attenuation level (more than 25 dB, 30 dB, 33 dB, 34 dB, or more than 35 dB).

The signal measuring device 5 is designed to measure a spectrum of signals that lie within the reception band of a corresponding mobile communications band. Thereby, in this exemplary embodiment, these signals are output via the RX connection 25b of the RX/TX filter assembly 25. Simultaneously, the signal measuring device 5 is further designed to measure a spectrum of test signals $f_1$, $f_2$, which are supplied via the decoupling unit 24 to the signal measuring device 5. The measurement of the test signals $f_1$, $f_2$ in the transmitting belt and the measurement of the signals in the reception band of the mobile communications band can be done in parallel or sequentially.

The first measuring device 2 also comprises another display and/or output device 27. The signal measuring device 5 is designed to show the spectrum of the measured signal or the spectrum of the test signals $f_1$, $f_2$ on the display and/or output device 27. The corresponding spectra can also be stored in a memory unit (not displayed). In the simplest case, the display and/or output device is a screen. The signal measuring device 5 can, for example, be a spectrum analyser or a network analyser.

The second measuring device 6 could be set up in accordance with FIG. 2B. In this exemplary embodiment, the second measuring device 6 also comprises an RX/TX filter assembly 30; The RX/TX filter assembly 30 includes a common connection 30a. This is connected to the third connection $9_3$ of the directional coupler 9. The RX/TX filter assembly 30 also comprises an RX connection 30b and a TX connection 30c. The RX/TX filter assembly 30 comprise an attenuation/transmission gate function in such a way that, in particular, test signals $f_1$, $f_2$ in a transmission frequency band of the mobile communications band are allowed to pass from the TX connection 30c to the common connection 30a and signals in a reception frequency band of the mobile communications band are allowed to pass from the common connection 30a to the RX connection 30b. In contrast, a trap attenuation is applied to signals from the TX connection 30c to the RX connection 30b and to signals in a reception frequency band of the mobile communications band from the common connection 30a to the TX connection 30c. The values for the transmission gate attenuation or trap attenuation of the RX/TX filter assembly 30 of the second measuring device 6 approximately correspond to the values of the RX/TX filter assembly 25 of the first measuring device 2.

The second measuring device 6 also preferably comprises an amplifier device 31, which is designed to amplify the signal at the input connection 7. This amplifier device 31 is preferably an LNA (low-noise amplifier). A plurality of LNAs can also be used, which are connected in series.

The signal measuring device 8 of the second measuring device 6 is preferably a spectrum analyser. The RX connection 30b of the RX/TX filter assembly 30 can be directly connected to the amplifier device 31. In turn, the amplifier device 31 is preferably connected directly to the signal measuring device 8.

The RX connection 30b of the RX/TX filter assembly 30 can also be connected to a first connection 32a of a bandpass assembly 32. The bandpass assembly 32 then has another second connection 32b, via which it is connected to the amplifier device 31. The bandpass assembly 32 is designed to only allow signals from the first connection 32a to the second connection 32b that fall into the reception band of the mobile communications band. Other signals, in particular, the test signals $f_1$, $f_2$ are attenuated using with a high trap attenuation level (more than 25 dB, 30 dB, 32 dB, 33 dB, 34 dB or more than 35 dB).

The TX connection 30c of the RX/TX filter assembly 30 is preferably finalized with a load 35, which absorbs the energy of signals at the TX connection 30c so that no reflections occur.

The second measuring device 6 also preferably comprises another display and/or output device 33. In the case of this, it preferably has to do with a screen. The signal measuring device 8 of the second measuring device 6 is designed to display the spectrum of the measured signal on the display and/or output device 33.

In principle, the first measuring device 2 and the second measuring device 6 could share a display and/or output device.

In order to be able to make precise statements about in which area of the measuring assembly 1 intermodulations occur, it is advantageous if the signal measuring devices 5, 8 of the first and second measuring devices 2, 6 (to each other) are calibrated. For this purpose, in particular, a calibration device (not shown) is used. This calibration device is designed to generate and to output an intermodulation signal. Thereby, in particular, it is a signal in the reception band of a mobile communications band. Such a signal can be calculated, for example, in accordance with the following formula, $f=2-f_1-f_2$. Such a signal would occur if the first and second amplifier device 20a, 20b of the first measuring device 2 would generate test signals at the frequencies $f_1$ and $f_2$, which meet at an interference point at which intermodulations then arise.

The calibration device can be arranged, for example, between the directional coupler 9 and the first measuring device 2. In particular, this is then performed if the second attenuation factor is greater than the first attenuation factor. In this case, a signal from the first connection $9_1$ to the second connection $9_2$ of the directional coupler 9 is output at the third connection $9_3$ of the directional coupler 9, thereby being attenuated less strongly than if a signal is transmitted from the second connection $9_2$ to the first connection $9_1$ of the directional coupler 9. A gain factor of the amplifier device 31 of the second measuring device 6 is then adjustable in such a way that a measured signal level of the second measuring device 6 approximately corresponds to the measured signal level of the first measuring device 2. The gain factor is primarily intended to compensate for the attenuation by the directional coupler 9.

In principle, the calibration device could also be arranged between the directional coupler 9 and the device under test (DUT) 10. In particular, this is then performed if the first attenuation factor is greater than the second attenuation factor. In this case, a signal transmitted from the second connection $9_2$ of the directional coupler 9 to the first connection $9_1$ of the directional coupler 9 is output at the third connection $9_3$, thereby being less strongly attenuated than a signal that is transmitted from the first connection $9_1$ to the second connection $9_2$ of the directional coupler 9. A gain factor of the amplifier device 31 of the second measuring device 6 is then adjustable in such a way that a measured signal level by the second measuring device 6 approximately corresponds to the measured signal level by the first measuring device 2. The wording "approximately" includes deviations of preferably less than 40%, 30%, 20%, 10% or less than 5%. Also, in this case in particular, the gain factor of the amplifier device 31 must compensate for the attenuation by the directional coupler 9. In both cases, the gain factor is preferably at least 3 dB.

Figure 3A:
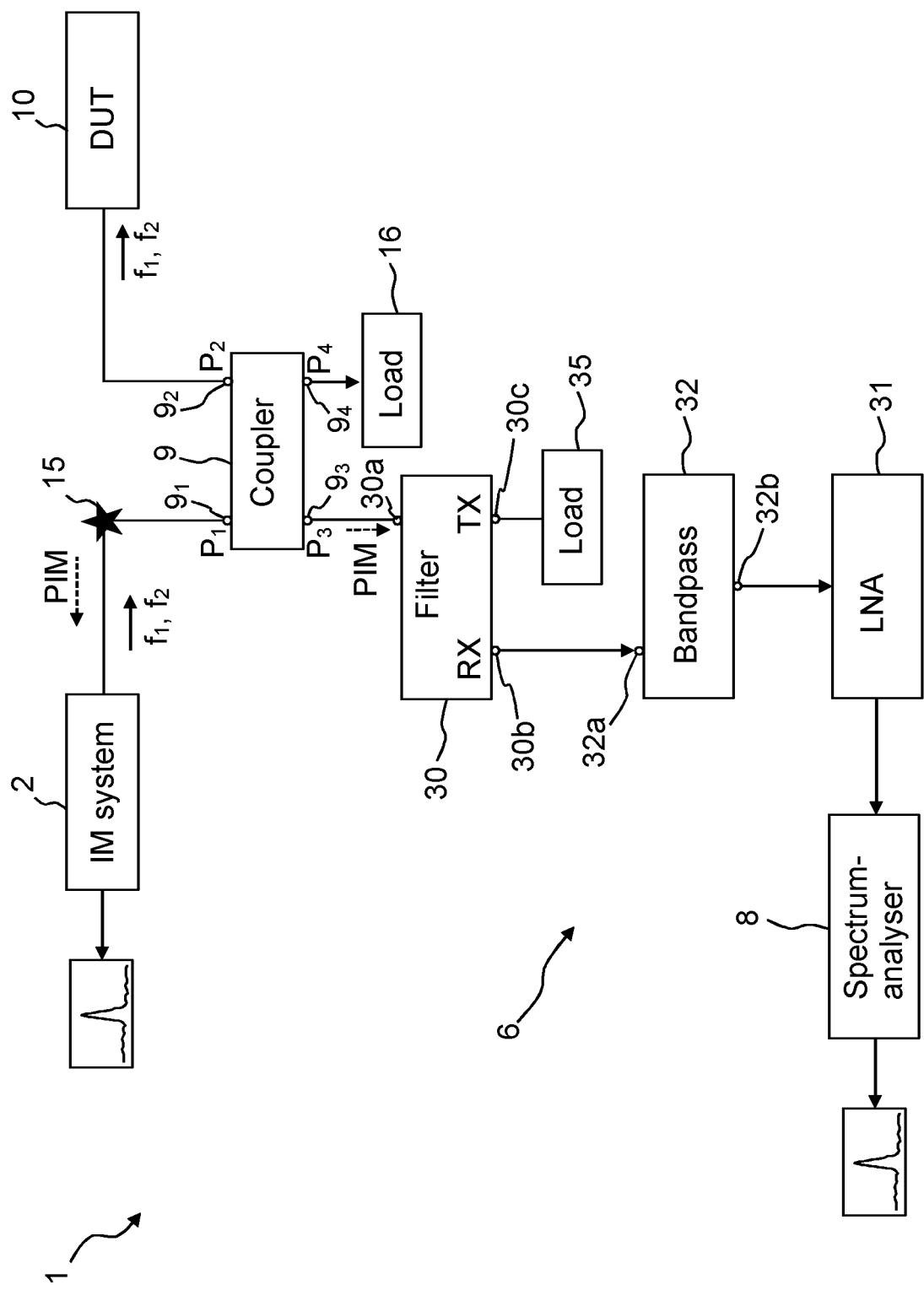

FIG. 3A shows an exemplary embodiment of the measuring assembly 1 according to the invention, on the basis of which the detection of intermodulations is explained in more detail. With regard to the structure of the first measuring device 2 and the second measuring device 6, reference is made to the previous embodiments. The first measuring device 2 is connected on the first connection $9_1$ of the directional coupler 9. The second measuring device 6 is connected at the third connection $9_3$ of the directional coupler 9. The device under test 10 is connected at the second connection $9_2$ of the directional coupler 9. In this case, the fourth connection $9_4$ of the directional coupler 9 is connected to a load 16. This serves to absorb as much energy as possible from signals flowing from the fourth connection $9_4$ into load 16 so that no reflections occur. In this exemplary embodiment, the second attenuation factor is greater than the first attenuation factor. In this case, an interference point 15 is available between the directional coupler 9 and the first measuring device 2. The resulting intermodulations (PIM) are transferred once directly into the first measuring system 2 and measured there and are also displayed, as is shown in FIG. 3A. The intermodulations are also transmitted in the direction of the directional coupler 9 and there, being slightly attenuated, they are output at the third connection $9_3$ and supplied to the second measuring device 6. This measures the intermodulations and also displays them. Due to a calibration carried out, the measured levels at both measuring devices 2, 6 are approximately the same. In principle, the level of the measured intermodulation in the second measuring device 6 could also be slightly lower (e.g. 3 dB) than in the first measuring device 2. A user can then compare these levels and determine where the intermodulation occurs, i.e. where the interference point 15 is located.

Figure 3B:
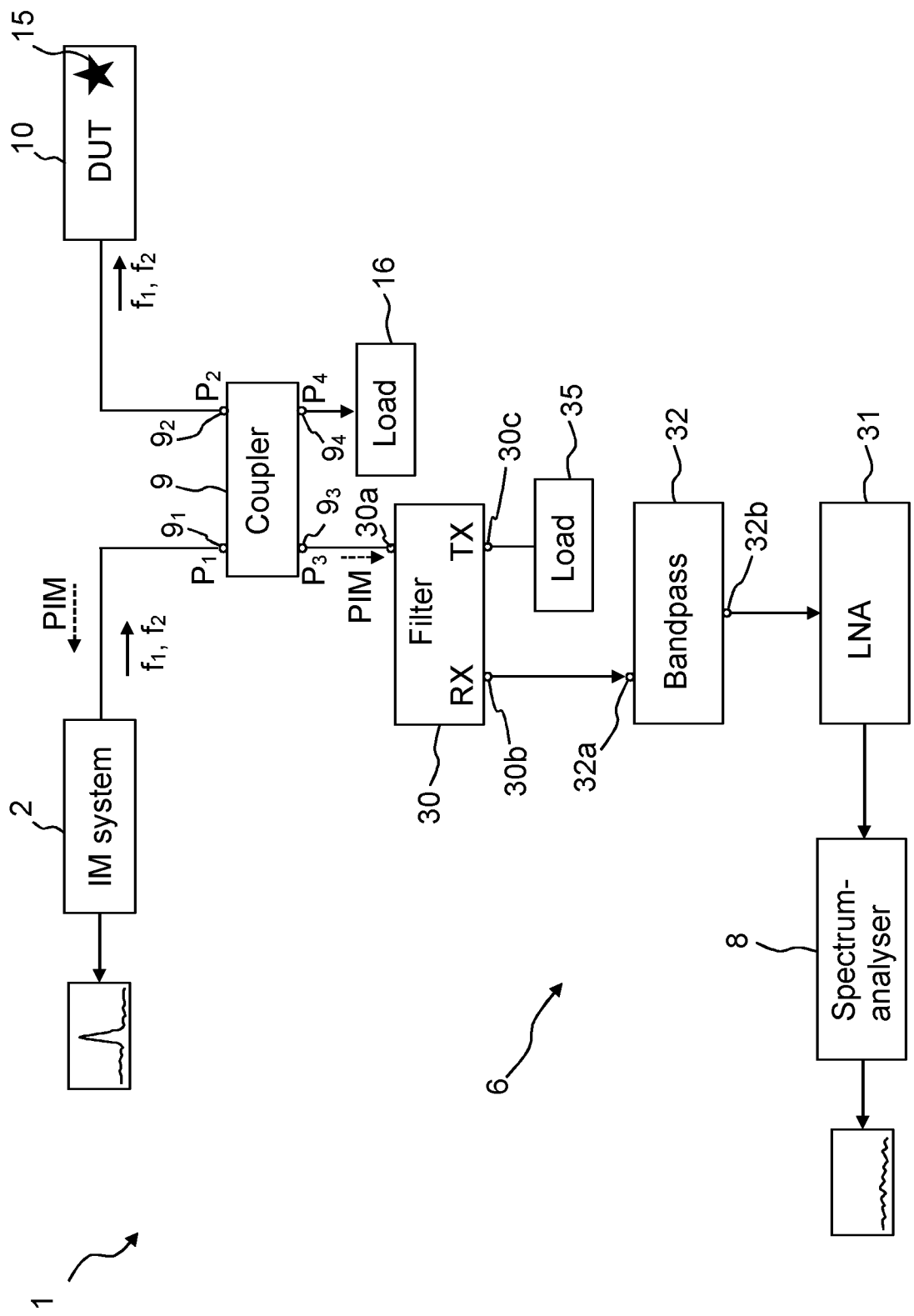

The situation is different in FIG. 3B. Here, the interference point 15 is located in the device under test 10. The device under test 10 functions here in a faulty manner. The resulting intermodulations are transferred from the second connection $9_2$ to the first connection $9_1$ of the directional coupler 9 and from there, to the first measuring device 2. The intermodulations are output at the third connection $9_3$ of the directional coupler 9, however thereby being very strongly attenuated (more than 25 dB, 30 dB, 32 dB, 34 dB or more than 35 dB). The second measuring device 6 does not measure a significant level of intermodulation in this exemplary embodiment. When looking at the display and/or output devices 27, 33, the user can therefore assign the interference point 15 to the correct area of the measuring assembly.

In principle, a control device could also be available. The control device could then be used for automatic evaluation. Depending on the measurement values of the signal measuring device 5 of the first measuring device 2 and the measurement values of the signal measuring device 8 of the second measuring device 6, the control device can determine whether an interference point 15 is located between the directional coupler 9 and the first measuring device 2 or between the directional coupler 9 and the device under test 10.

If the second attenuation factor is greater than the first attenuation factor (see FIGS. 3A, 3B), then the control device is designed to assign the interference point 15 to an area between the directional coupler 9 and the first measuring device 2 if a signal level of a signal measured by the signal measuring device 5 of the first measuring device 2 is above a first threshold value and if a signal level of a signal measured by the signal measuring device 8 of the second measuring device 6 is at least 20% of the level of the signal level of the signal measured by the signal measuring device 5 of the first measuring device 2. This would be the case in FIG. 3A. If no calibration takes place, then the signal level at the second measuring device 6 is approximately 50% (attenuation 3 dB) of the signal level at the first measuring device 2.

With regard to FIG. 3B, the control device is designed to assign the interference point 15 to an area between the directional coupler 9 and the device under test 10 if a signal level of a signal measured by the signal measuring device 5 of the first measuring device 2 is above a first threshold value and a signal level of a signal measured by the signal measuring device 8 of the second measuring device 6 is smaller than 20% of the level of the signal level of the signal measured by the signal measuring device 5 of the first measuring device 2.

The threshold values can be selected as desired. They should at least be chosen in such a way that most signals caused by intermodulation exceed them. This can be found out by statistical means.

Figure 5:
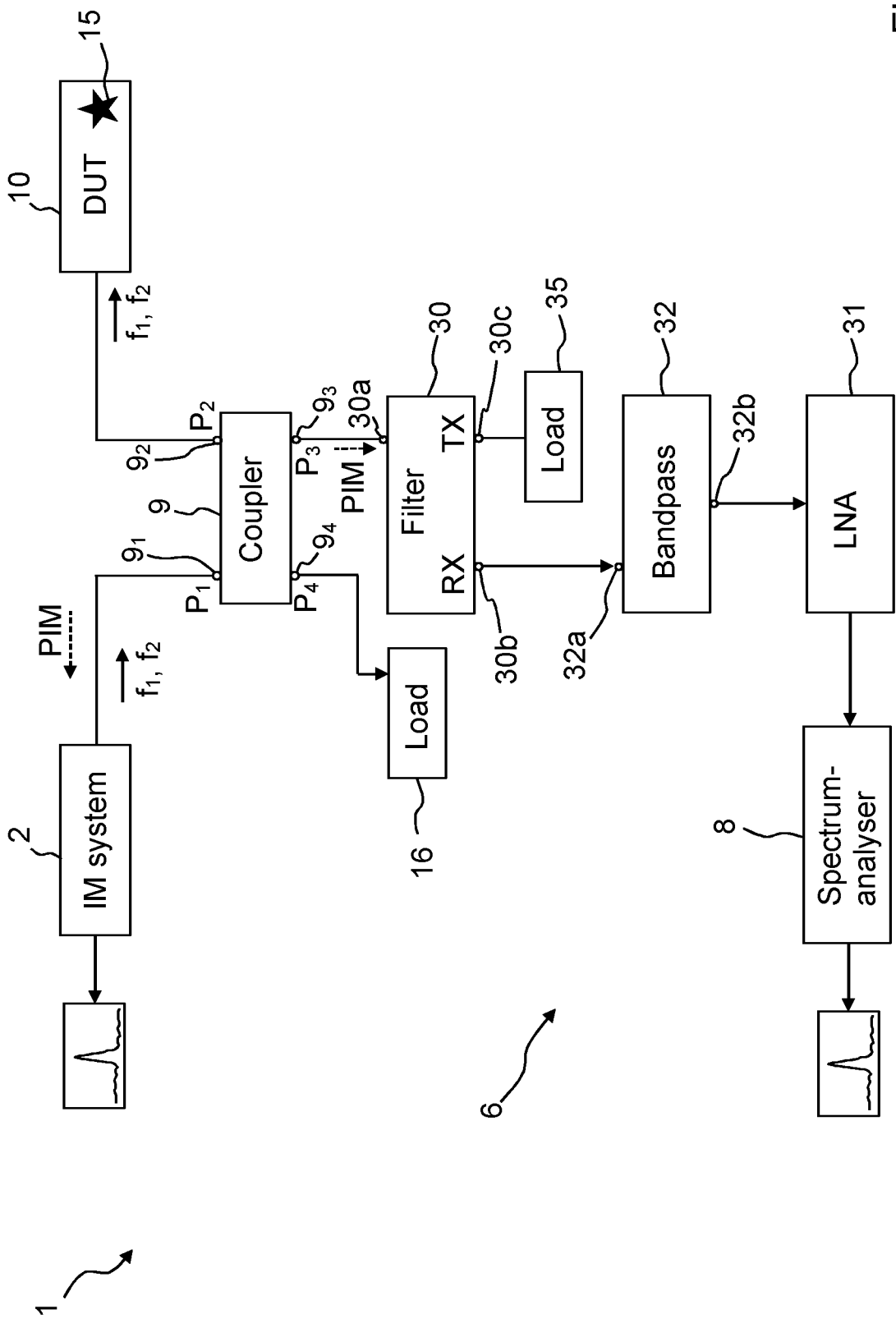

Referring to FIG. 5, it is shown that the first attenuation factor is greater than the second attenuation factor. The control device is then designed to assign the interference point 15 to an area between the directional coupler 9 and the device under test 10 if a signal level of a signal measured by the signal measuring device 5 of the first measuring device 2 is above a first threshold value and if a signal level of a signal measured by the signal measuring device 8 of the second measuring device 6 reaches a minimum of 20% of the level of the signal level of the signal measured by the signal measuring device 5 of the first measuring device 2. In this case, both the first as well as the second measuring device 2, 6 indicate a corresponding level for an intermodulation. Due to the fact that intermodulation signals in this case are transmitted from the second connection $9_2$ of the directional coupler 9 to the third connection $9_3$ of the directional coupler 9 only in a slightly attenuated form (e.g. 3 dB) and thus to the second measuring device 6, this also shows a clear signal level.

On the other hand, in the case of FIG. 5, the second measuring device 5 would not indicate any signal level or a signal level smaller than 20% of the measured signal level of the first measuring device 2 if the interference point 15 is located within an area between the first connection $9_1$ of the directional coupler 9 and the first measuring device 2.

In FIGS. 4A, 4B, 4C and 4D, instead of a load 16, an antenna 17, which can also be called a sniffer antenna 17, is connected to the fourth connection $9_4$ of the directional coupler 9. This antenna 17 is a normal, such as a dipole antenna or a logarithmic-periodic antenna for example.

Figure 4A:
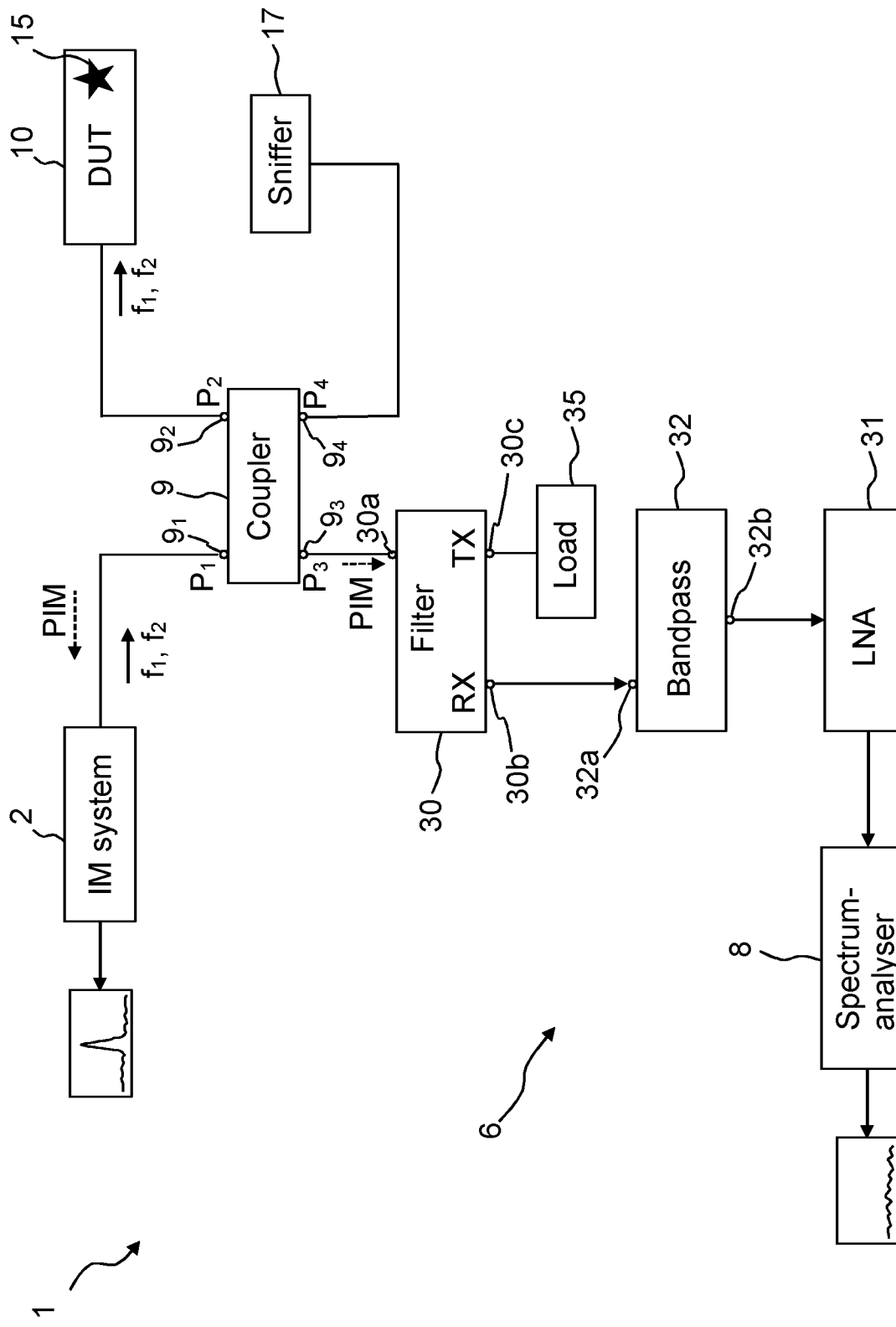

In FIG. 4A, the interference point 15 is again located in the device under test 10. Consequently, because the second attenuation factor of the directional coupler 9 is greater than the first attenuation factor, only the first measuring device 2 indicates a signal level. The second measuring device 6 does not detect such a signal level or the level is clearly lower than that of the first measuring device 2 (e.g. attenuated by more than 30 dB, 40 dB, 50 dB or more than 60 dB)

Figure 4B:
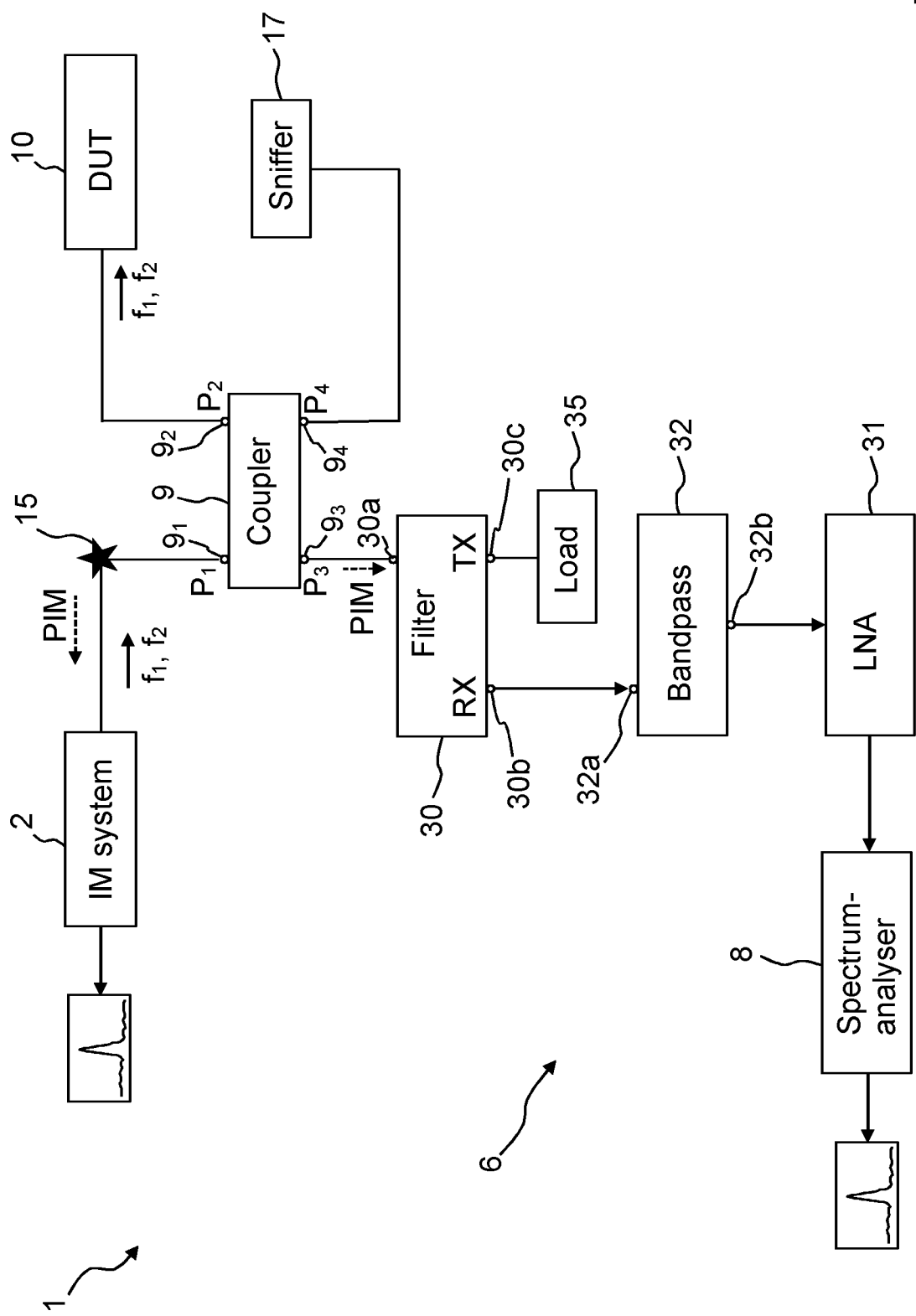

In FIG. 4B, the interference point 15 is located between the directional coupler 9 and the first measuring device 2. In this case, both the first measuring device 2 as well as second measuring device 6 detects a corresponding signal level of the intermodulations.

Figure 4C:
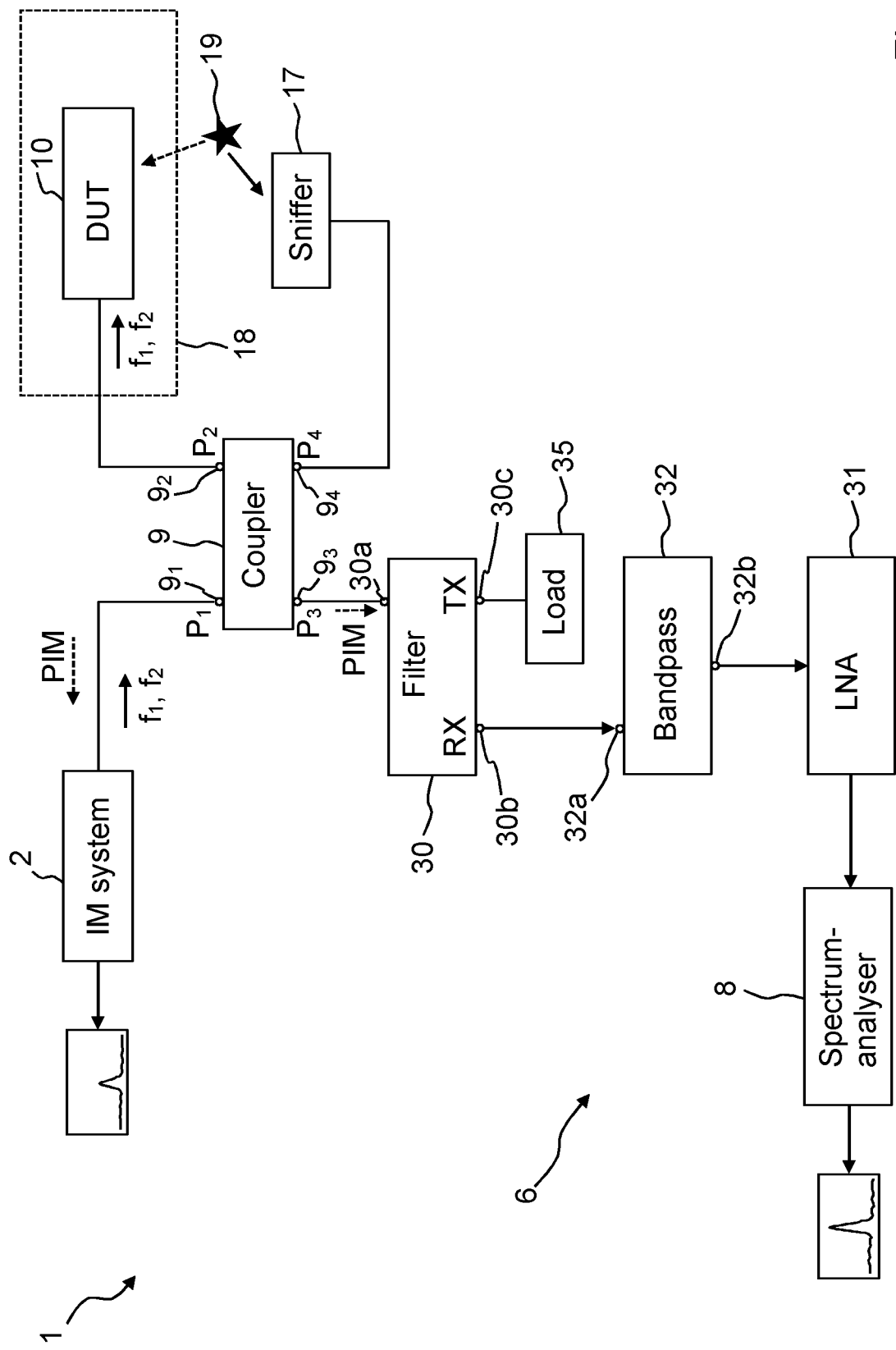

In contrast, there is no interference point 15 in FIG. 4C but an interference source 19. Furthermore, a measuring chamber 18 is provided, in which the device under test 10 is arranged. The antenna 17 is arranged outside the measuring chamber 18. The interference source 19 is also located outside the measuring chamber 18 in this case. The interference source 19 can be, for example, couplings by mobile communication cells or mobile terminal devices.

In this exemplary embodiment, this interference source 19 only couples into the device under test 10 in a very strongly attenuated form, because the device under test 10 is shielded by the measuring chamber 18. The measuring chamber 18 attenuates the interference source 19 by preferably more than 25 dB or more than 30 dB. In contrast, the antenna 17 receives this interference source 19 without (significant) attenuation. The signal of the antenna 17 is transmitted from the fourth connection $9_4$ of the directional coupler 9 to the third connection $9_3$ of the directional coupler 9 and thus to the second measuring device 6. The second measuring device 6 measures this signal and displays it. The signal, which is, in contrast, strongly attenuated by the measuring chamber 18 and is coupled into the device under test 10, is transmitted from the second connection $9_2$ of the directional coupler 9 to the first connection $9_1$ of the directional coupler 9, thereby being measured and displayed by the first measuring device 2. The signal level measured by the first measuring device 2 is lower than the signal level measured by the second measuring device 6. In contrast, the signal received from the antenna 17 is output at the first connection $9_1$ of the directional coupler 9, thereby being more strongly attenuated than the signal coupled into the device under test 10.

Figure 4D:
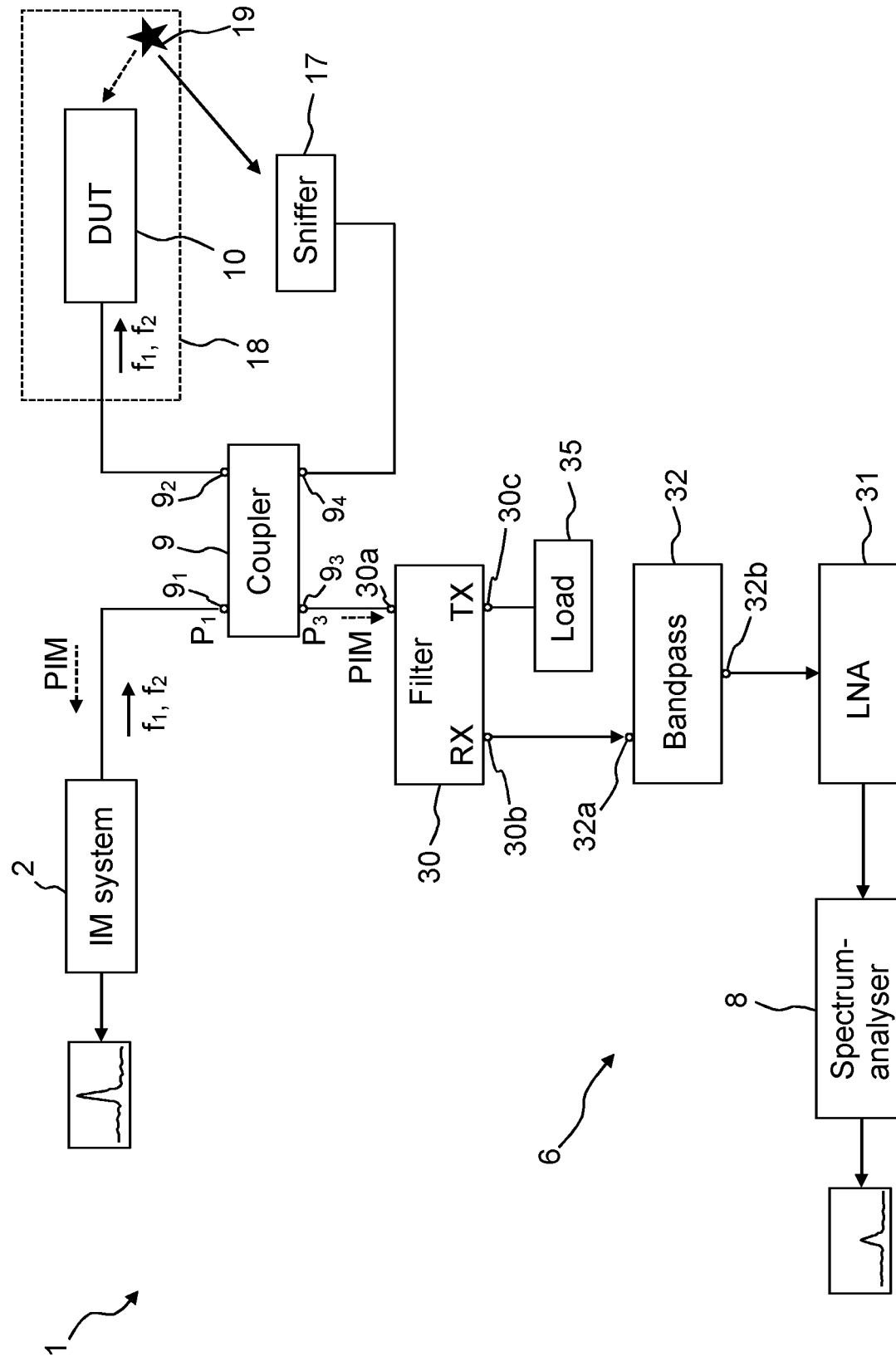

In contrast, the situation is different in FIG. 4D. Here, the interference source 19 is located inside the measuring chamber 18. The interference source 19 therefore couples into the device under test 10. The signal is transmitted from the second connection $9_2$ of the directional coupler 9 to the first connection $9_1$ of the directional coupler 9 and then to the first measuring device 2, thereby being measured and displayed by the first measuring device 2. The signal itself is output at the third connection $9_3$ of the directional coupler 9 in attenuated form and is no longer displayed by the second measuring device 6. However, the interference source 19 itself also couples into the antenna 17. However, the signal of the interference source 19 itself is strongly attenuated by the measuring chamber 18 (more than 25 dB, 30 dB, etc.). This signal, which is coupled into the antenna 17 in attenuated form, is, in turn, transmitted from the fourth connection $9_4$ to the third connection $9_3$ of the directional coupler 9 and then displayed by the second measuring device 6 with relation to the signal at the first connection $9_1$ of the directional coupler 9 in attenuated form.

When connecting a corresponding antenna 17, a control device can also be provided, which performs the evaluation automatically. Thereby, in particular, the evaluation depends on if the second attenuation factor is greater than the first attenuation factor or if the fourth attenuation factor is greater than the third attenuation factor (or vice versa).

Once again, FIGS. 6A and 6B illustrate the structure of the measuring assembly 1. The first measuring device 2 is connected to the device under test (DUT) 10 via various cables 40. FIG. 6A shows that RF adapters 41 are used to connect various 40 cables to one another. For example, these RF adapters 41 can be corresponding connectors that are applied to the end of the cables 40. Furthermore, in FIG. 6A, there is another RF switch 42, via which the first measuring device 2 can be connected to a connection of a plurality of connections of the device under test 10. Thereby, the RF switch 42 can be controlled by a higher-level control unit. In addition to a connection for the first measuring device 2, it also includes a plurality of output connections, which are connected to a connection of the device under test. In the exemplary embodiment from FIGS. 6A and 6B, only one output connection is shown at the RF switch 42. At this output connection, a cable 40 is connected again, which is connected via another RF adapter 41 with another cable. This other cable is then guided through an RF feedthrough 43 into the measuring chamber 18, in which the device under test 10 is arranged.

The second measuring device 6 can be arranged together with the directional coupler 9 in FIG. 6A at those points in the transmission path at which a circle is drawn. This can be, for example, between the first measuring device 2 and the RF adapter 41 or between the RF adapter 41 and the RF switch 42. The second measuring device 6 together with the directional coupler 9 can also be arranged between the RF switch 42 and the further RF adapter 41 or the further RF adapter 41 and the feedthrough 43 or the feedthrough 43 and the device under test 10.

FIG. 6B shows how the directional coupler 9 is arranged together with the second measuring device 6 into the transmission path between the first measuring device 2 and the subsequent RF adapter 41. In this case, for example, the cable 40 can be disconnected. It is also possible that the RF adapter 41, via which two cables 40 are connected to each other, is opened and (directly) connected to the directional coupler 9.

Even if the previous embodiments usually mention a mobile communications band, which includes mobile communications standards, such as GSM, UMTS, LTE, devices under test that use a mobile communications standard can be tested using the measuring assembly 1.

Some of the embodiments contemplated herein are described more fully with reference to the accompanying drawings. Other embodiments, however, are contained within the scope of the subject matter disclosed herein. The disclosed subject matter should not be construed as limited to only the embodiments set forth herein; rather, these embodiments are provided by way of example to convey the scope of the subject matter to those skilled in the art.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

The invention claimed is:

1. A measuring assembly for detecting intermodulations, the measuring assembly comprising:

a first measuring device with an output connection, wherein the first measuring device comprises a signal generation device and a signal measuring device, wherein the signal generation device of the first measuring device is designed to generate test signals and to output these at the output connection, and wherein the signal measuring device of the first measuring device is designed to measure signals that are applied at the output connection;

a second measuring device with an input connection and a signal measuring device, wherein the signal measuring device of the second measuring device is designed to measure signals that are applied at the input connection;

a directional coupler that comprises at least one first, one second, and one third connection; and a control device, wherein:
the output connection of the first measuring device is connected to the first connection of the directional coupler,
the second connection of the directional coupler is connected to a device under test,
the input connection of the second measuring device is connected to the third connection of the directional coupler,
the directional coupler is designed to transmit signals from the first connection to the second connection and to output them at the third connection, thereby being attenuated with a first attenuation factor, and
the directional coupler is designed to transmit signals from the second connection to the first connection and to output them at the third connection, thereby being attenuated with a second attenuation factor, wherein a value of the first attenuation factor and a value of the second attenuation factor is different, and wherein a location of an interference point, that causes the intermodulations, is detected by the control device based on the value of the first attenuation factor being different from the value of the second attenuation factor, and based on measurement values of the signal measuring device of the first measuring device and measurement values of the signal measuring device of the second measuring device.

2. The measuring assembly according to claim 1, wherein:
the signal measuring device of the first measuring device and the signal measuring device of the second measuring device are designed to measure a spectrum of signals.

3. The measuring assembly according to claim 2, wherein:
the first measuring device and the second measuring device comprise a display and/or output device,
the signal measuring device of the first measuring device is designed to display the spectrum of the measured signal on the display and/or output device, and
the signal measuring device of the second measuring device is designed to display the spectrum of the measured signal on the display and/or output device.

4. The measuring assembly according to claim 1, wherein:
the control device is designed to determine, depending on the measurement values of the signal measuring device of the first measuring device and the measurement values of the signal measuring device of the second measuring device, if the interference point that causes intermodulations is located between the directional coupler and the first measuring device or between the directional coupler and the device under test.

5. The measuring assembly according to claim 4, wherein:
when the second attenuation factor is greater than the first attenuation factor, the control device is designed to:
assign the interference point to an area between the directional coupler and the device under test if a signal level of a signal measured by the signal measuring device of the first measuring device is above a first threshold value and if a signal level of a signal measured by the signal measuring device of the second measuring device reaches a minimum of 20% of the level of the signal level of the signal measured by the signal measuring device of the first measuring device, or
assign the interference point to an area between the directional coupler and the device under test if a signal level of a signal measured by the signal measuring device of the first measuring device is above a first threshold value and if a signal level of a signal measured by the signal measuring device of the second measuring device is smaller than 20% of the level of the signal level of the signal measured by the signal measuring device of the first measuring device; or
when the first attenuation factor is greater than the second attenuation factor, the control device is designed to:
assign the interference point to an area between the directional coupler and the device under test if a signal level of a signal measured by the signal measuring device of the first measuring device is above a first threshold value and if a signal level of a signal measured by the signal measuring device of the second measuring device reaches a minimum of 20% of the level of the signal level of the signal measured by the signal measuring device of the first measuring device, or
assign the interference point to an area between the directional coupler and the device under test if a signal level of a signal measured by the signal measuring device of the first measuring device is above a first threshold value and if a signal level of a signal measured by the signal measuring device of the second measuring device is smaller than 20% of the level of the signal level of the signal measured by the signal measuring device of the first measuring device.

6. The measuring assembly according to claim 1, wherein:
the directional coupler comprises a fourth connection,
the directional coupler is designed to transmit signals from the third connection to the fourth connection and to output them at the first connection thereby being attenuated with a third attenuation factor, and
the directional coupler is designed to transmit signals from the fourth connection to the third connection and to output them at the first connection, thereby being attenuated with a fourth attenuation factor, wherein a value of the third attenuation factor and a value of the fourth attenuation factor is different.

7. The measuring assembly according to claim 6, wherein:
the fourth connection of the directional coupler is connected to a load.

8. The measuring assembly according to claim 6, further comprising:
an antenna connected to the fourth connection of the directional coupler.

9. The measuring assembly according to claim 8, further comprising:
a measuring chamber, wherein;

the device under test is arranged inside the measuring chamber; and the antenna is located outside the measuring chamber.

10. The measuring assembly according to claim 9, wherein:

the control device is designed to determine, depending on the measurement values of the signal measuring device of the first measuring device and the measurement values of the signal measuring device of the second measuring device, if an interference source is located within the measuring chamber or outside the measuring chamber and couples into the measuring assembly in a wireless manner.

11. The measuring assembly according to claim 10, wherein:

when the second attenuation factor is greater than the first attenuation factor and the fourth attenuation factor is greater than the third attenuation factor, the control device is designed to:

assign the interference source to an area outside the measuring chamber if a signal level of a signal measured by the signal measuring device of the first measuring device is smaller than a signal level of a signal measured by the signal measuring device of the second measuring device; or assign the interference source to an area inside the measuring chamber if a signal level of a signal measured by the signal measuring device of the first measuring device is greater than a signal level of a signal measured by the signal measuring device of the second measuring device, or when the first attenuation factor is greater than the second attenuation factor and the third attenuation factor is greater than the fourth attenuation factor, the control device is designed to:

assign the interference source to an area outside the measuring chamber if a signal level of a signal measured by the signal measuring device of the first measuring device is smaller than a signal level of a signal measured by the signal measuring device of the second measuring device; or assign the interference source to an area within the measuring chamber if a signal level of a signal measured by the signal measuring device of the first measuring device is greater than a signal level of a signal measured by the signal measuring device of the second measuring device.

12. The measuring assembly according to claim 1, wherein:

the second measuring device comprises an amplifier device that is designed to amplify the signal at the input connection.

13. The measuring assembly according to claim 12, further comprising:

a calibration device;

designed to generate and to output an intermodulation signal, wherein:

when the calibration device is arranged between the directional coupler and the first measuring device;

the second attenuation factor is greater than the first attenuation factor, and a gain factor of the amplifier device of the second measuring device is adjustable in such a way that a measured signal level of the second measuring device approximately corresponds to the measured signal level of the first measuring device; or when the calibration device is arranged between the directional coupler and the device under test:

the first attenuation factor is greater than the second attenuation factor, and a gain factor of the amplifier device of the second measuring device is adjustable in such a way that a measured signal level of the second measuring device approximately corresponds to the measured signal level of the first measuring device.

14. The measuring assembly according to claim 12, wherein:

the second measuring device comprises an RX/TX filter assembly, the RX/TX filter assembly comprises a common connection, which is connected to the third connection of the directional coupler, the RX/TX filter assembly comprises an RX connection and a TX connection, the RX/TX filter assembly has an attenuation/transmission gate function in such a way that:

signals in a reception frequency band are allowed to pass from the common connection to the RX connection;

a trap attenuation is applied to signals from the TX connection to the RX connection; and a trap attenuation is applied to signals in a reception frequency band from the common connection to the TX connection.

15. The measuring assembly according to claim 14, wherein:

the RX/TX filter assembly is designed to apply a trap attenuation to test signals that are generated by the signal generation device of the first measuring device.

16. The measuring assembly according to claim 14, wherein:

the RX connection of the RX/TX filter assembly is connected to:

the amplifier device; or a first connection of a bandpass assembly, wherein the bandpass assembly has a second connection and is designed to allow only signals from the first connection to the second connection that fall into the reception band of a certain wireless communications band, wherein the second connection is connected to the amplifier device.

17. The measuring assembly according to claim 12, wherein:

the amplifier device is connected directly to the signal measuring device of the second measuring device.

18. The measuring assembly according to claim 1, wherein:

the signal generation device of the first measuring device comprises a first and a second signal generator;

the first signal generator is designed to generate a test signal at a first frequency;

the second signal generator is designed to generate a test signal at a second frequency, wherein the first and the second frequencies are different;

the signal generation device of the first measuring device comprises a first amplifier device and a second amplifier device;

the first amplifier device is designed to amplify the test signal of the first signal generator;

the second amplifier device is designed to amplify the test signal of the second signal generator; and the outputs of the first and second amplifier device are combined at the output connection of the first measuring device.

19. The measuring assembly according to claim 18, wherein:
the first measuring device comprises an RX/TX filter assembly;
the RX/TX filter assembly comprises a common connection, which is connected to the output connection of the first measuring device;
the RX/TX filter assembly comprises an RX connection and a TX connection;
the RX/TX filter assembly has an attenuation/transmission gate function in such a way that:
test signals in a transmission frequency band are allowed to pass from the TX connection to the common connection;
signals in a reception frequency band are allowed to pass from the common connection to the RX connection;
a trap attenuation is applied to test signals from the TX connection to the RX connection;
a trap attenuation is applied to signals in a reception frequency band from the common connection to the TX connection; and
the outputs of the first and second amplifier device are combined at the TX connection of the RX/TX filter assembly of the first measuring device.

20. The measuring assembly according to claim 19, wherein:
the RX connection of the RX/TX filter assembly of the first measuring device is connected to:
the signal measuring device of the first measuring device; or
a first connection of a bandpass assembly, wherein the bandpass assembly has a second connection and is designed to allow only signals from the first connection to the second connection that fall into the reception band of a certain wireless communications band, wherein the second connection is connected to the signal measuring device of the first measuring device.

* * * * *